US009923520B1

(12) United States Patent
Abdelfattah et al.

(10) Patent No.: US 9,923,520 B1
(45) Date of Patent: Mar. 20, 2018

(54) SWITCHING POWER SUPPLY FOR RF POWER AMPLIFIERS

(71) Applicant: QUALCOMM Incorporated, San Diego, CA (US)

(72) Inventors: Moataz Abdelsamie Abdelfattah, Columbus, OH (US); Iulian Mirea, San Diego, CA (US); Song Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/272,139

(22) Filed: Sep. 21, 2016

(51) Int. Cl.
H03F 1/30 (2006.01)
H03F 1/02 (2006.01)
H03F 3/21 (2006.01)
H03F 3/19 (2006.01)
H02M 3/155 (2006.01)
H02M 1/08 (2006.01)

(52) U.S. Cl.
CPC ............ *H03F 1/0222* (2013.01); *H02M 1/08* (2013.01); *H02M 3/155* (2013.01); *H03F 3/19* (2013.01); *H03F 3/21* (2013.01); *H03F 2200/105* (2013.01); *H03F 2200/294* (2013.01); *H03F 2200/451* (2013.01); *H03F 2200/78* (2013.01)

(58) Field of Classification Search
CPC .......................................................... H03F 1/30
USPC ........................................ 330/297, 296, 285
See application file for complete search history.

(56) References Cited

U.S. PATENT DOCUMENTS

| 7,826,815 | B2 | 11/2010 | Ajram et al. |
| 8,294,445 | B2 | 10/2012 | Kwok |
| 8,958,762 | B2 | 2/2015 | Huang et al. |
| 9,059,793 | B2 | 6/2015 | Shi et al. |
| 9,112,409 | B2 * | 8/2015 | Li .......................... H03F 1/0227 |

(Continued)

FOREIGN PATENT DOCUMENTS

WO 2009083467 A1 7/2009

OTHER PUBLICATIONS

Honda Y., et al., "A Wide Supply Voltage and low-Rx noise Envelope Tracking Supply Modulator IC for LTE Handset Power Amplifiers," Proceedings of the 42nd European Microwave Conference, Oct. 29-Nov. 1, 2012, pp. 1253-1256.

(Continued)

Primary Examiner — Henry Choe
(74) Attorney, Agent, or Firm — Colby Nipper/Qualcomm

(57) ABSTRACT

The present disclosure describes a synchronized switching power supply for a radio frequency (RF) power amplifier. In some aspects, a synchronized power supply circuit comprises a first switch connected between a power rail and a first terminal of an inductor that is connected to an output of the circuit via its second terminal. The circuit also includes a second switch connected between a ground rail and the first terminal of the inductor, and respective gate drivers for the first and second switches. An amplifier of the circuit is connected to the power rail and has an output connected to the output of the circuit. A current sensor is connected between the output of the amplifier and the output of the circuit, with an output of the current sensor being connected to an input of a comparator. A delay circuit is connected between an output of the comparator and the first and second gate drivers, and may synchronize the power supply circuit.

26 Claims, 10 Drawing Sheets

(56) References Cited

U.S. PATENT DOCUMENTS

2015/0188432 A1* 7/2015 Vannorsdel ........... H02M 3/156
323/271
2015/0381068 A1* 12/2015 Newman, Jr. ......... H02M 1/081
323/300

OTHER PUBLICATIONS

Kato K., et al., "A High Efficiency and Low Rx-Noise Three Power Mode Power Amplifier for W-CDMA Handsets," Proceedings of Asia-Pacific Microwave Conference (APMC), Dec. 4-7, 2012, pp. 472-474.

Herminio M.G., et al., "Four-Quadrant Linear-Assisted DC/DC Voltage Regulator," Analog Integrated Circuits and Signal Processing, Springer New York LLC, US, vol. 88. No. 1, Apr. 23, 2016 (Apr. 23, 2016), pp. 151-160. XP035898949, [retrieved on Apr. 23, 2016].

International Search Report and Written Opinion—PCT/US2017/047691—ISA/EPO—dated Nov. 16, 2017.

Rajdeep B., et al., "A Linear-Assisted DC-DC Hybrid Power Converter for Envelope Tracking RF Power Amplifiers," 2014 IEEE Energy Conversion Congress and Exposition (ECCE), IEEE, Sep. 14, 2014 (Sep. 14, 2014), pp. 5769-5773, XP032680873, [retrieved on Nov. 11, 2014].

* cited by examiner

SWITCHING POWER SUPPLY FOR RF POWER AMPLIFIERS

BACKGROUND

Field of the Disclosure

This disclosure relates generally to power circuits for radio frequency (RF) power amplifiers, more specifically, to switch-mode power supply circuits.

Description of Related Art

This description of related art is provided for the purpose of generally presenting a context for the disclosure that follows. Unless indicated otherwise herein, concepts described in this section are not prior art to this disclosure and are not admitted to be prior art by inclusion herein.

Radio frequency (RF) transmitters often implement envelope tracking (ET) power systems to improve efficiency of power amplifiers. These ET power systems include highly efficient switch-mode power supplies (SMPS) or switching DC-DC converters that provide power to the power amplifiers. While highly efficient, these switching power supplies may also be noisy due their discontinuous switching operations for power regulation. Switching noise on the power amplifier's incoming power can modulate with the transmit carrier and sub-harmonic signals in the power amplifier. This modulated switching noise is able to spread across the frequency spectrum, which includes frequency bands though which incoming signals are received. Due to the power disparity between transmit and receive signals, the noise generated by the power amplifier that falls in a receive band can impact receiver sensitivity and degrade receiver performance.

SUMMARY

In some aspects, a synchronized power supply circuit comprises a first switch connected between a power rail and a first terminal of an inductor that is connected to an output of the circuit via its second terminal. The circuit also includes a second switch connected between a ground rail and the first terminal of the inductor, and respective gate drivers for the first and second switches. An amplifier of the circuit is connected to the power rail and has an output connected to the output of the circuit. A current sensor is connected between the output of the amplifier and the output of the circuit, with an output of the current sensor being connected to an input of a comparator. A delay circuit is connected between an output of the comparator and the first and second gate drivers and may synchronize the power supply circuit.

In other aspects, a synchronized power supply circuit comprises a first switch connected between a power rail and a first terminal of an inductor that is connected to an RF power amplifier via its second terminal. The circuit also includes a second switch connected between ground and the first terminal of the inductor, and respective gate drivers for the first and second switches. A current sensor of the circuit is connected to the second terminal of the inductor, with an output of the current sensor connected to an input of a comparator. A delay circuit is connected between an output of the comparator and the first and second gate drivers. The delay circuit can delay switch control signals effective to synchronize the power supply circuit.

In yet other aspects, an apparatus for wireless communication comprises an RF power amplifier and an envelope tracking (ET) power system. The ET power system comprises a switch connected between a power rail and a first terminal of an inductor that is connected to the RF amplifier by its second terminal. The circuit also includes a gate driver connected to a gate of the switch and a class AB amplifier that is connected to the power rail and has an output connected to the RF amplifier. A current sensor is connected between the output of the class AB amplifier and the RF amplifier to monitor current, and a comparator of the ET power system has an input connected to an output of the current sensor. A delay circuit is connected between an output of the comparator and the gate driver, and may delay a switch control signal to synchronize switch-mode power provided by the ET power system.

In other aspects, a synchronized power supply circuit comprises a first switch connected between a power rail and a first terminal of an inductor that is connected to an output of the circuit via its second terminal. The circuit also includes a second switch connected between a ground rail and the first terminal of the inductor, and respective gate drivers for the first and second switches. An amplifier of the circuit is connected to the power rail and has an output connected to the output of the circuit. A current sensor is connected between the output of the amplifier and the output of the circuit, with an output of the current sensor being connected to an input of a comparator. The circuit also includes means for delaying a switch control signal between an output of the comparator and the first and second gate drivers. The means for delaying the switch control signal may synchronize the power supply circuit.

In other aspects, an apparatus for wireless communication comprises a radio frequency (RF) power amplifier and an envelope tracking (ET) power system. The ET power system may comprise a switch connected between a power rail and the RF power amplifier, a gate driver connected to a gate of the switch, a comparator configured to monitor a current flow, and a delay circuit connected between an output of the comparator and the gate driver.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Figure 1:
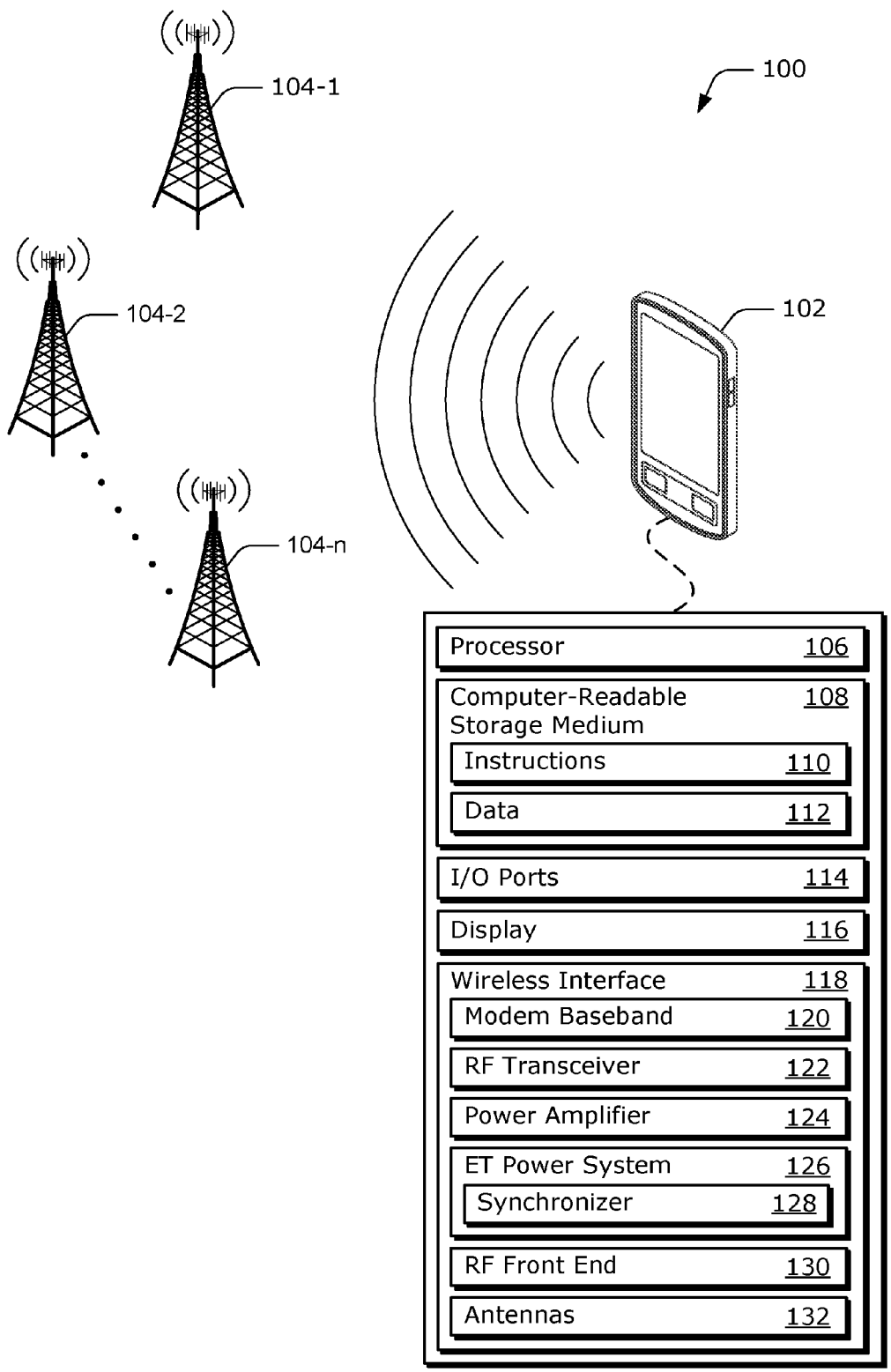
FIG. 1 illustrates an example environment that includes a computing device and wireless network.

RF transmitters and transceivers often implement envelope tracking (ET) power systems to improve efficiency of power amplifiers. These ET power systems provide power at a voltage that follows an envelope of a modulated signal amplified by the power amplifier prior to transmission. By reducing voltage overhead of the power amplifier, energy wasted during the amplification process is reduced. Because a frequency of the modulated signal is too high for most switching power supplies to follow, some ET power systems also include a class AB amplifier in parallel to provide higher frequency components of the power. In such a configuration, the class AB amplifier provides fidelity when sourcing current to the power amplifier and the switching regulator provides low frequency components of the power with high efficiency.

Although highly efficient, switching power supplies may also be noisy due their discontinuous switching operations associated with power regulation. This switching noise, when introduced into the power amplifier's supply, can modulate with the transmit carrier and sub-harmonic signals in the power amplifier. The modulated switching noise can then spread across the frequency spectrum, including frequency bands though which incoming signals are received. Due to the power disparity between transmit and receive signals, the noise generated by the power amplifier that falls in a receive band (e.g., receive band noise (RXBN)) can impact receiver sensitivity and degrade receiver performance.

Conventional noise reduction techniques may rely on pairing the switching regulator with a class AB amplifier that has low input impedance, such that the class AB amplifier will absorb or attenuate the switching noise. Designing and implementing a class AB amplifier having a low input impedance across a large bandwidth, however, is difficult and still may not be sufficient to reduce the switching noise across a large spectrum of frequencies. As such, conventional techniques of providing an alternate low impedance path for the switching noise can be difficult to implement and may be ineffective for different combinations of receive bands.

Aspects of power supplies, for example synchronized power supplies, for RF power amplifiers are described herein. The apparatuses and techniques described herein may enable switching operations of a switching power supply to be synchronized with an RF frequency to reduce harmonics of switching noise proximate that frequency. In some aspects, a switching regulator that provides power to an RF power amplifier is synchronized to a center frequency of a receive band. Due to the spectral energy distribution of the synchronized switching operations, this can be effective to create a notch in the switching noise around the center frequency of the receive band. By so doing, noise in the receive band can be reduced and sensitivity of a receiver can be improved. Alternately or additionally, the frequency to which the switching power supply is synchronized can be dynamically adjusted, such that noise can be reduced in different RF receive bands as a wireless device changes communication modes or channels.

In some aspects of synchronized power supplies for RF power amplifiers, a synchronized switching power supply circuit comprises a first switch connected between a power rail and a first terminal of an inductor that is connected to an RF amplifier via its second terminal. The circuit also includes a second switch connected between ground and the first terminal of the inductor, and respective gate drivers for the first and second switches. A current sensor of the circuit is connected to the second terminal of the inductor, with an output of the current sensor connected to an input of a comparator. A delay circuit is connected between an output of the comparator and the first and second gate drivers. The delay circuit may synchronize operation of the switches with a frequency, such as a center frequency of a receive band, effective to reduce switching noise proximate that frequency.

These and other aspects of switching power supplies for RF power amplifiers are described below in the context of an example environment, example power supply circuit, and techniques. Any reference made with respect to the example environment or circuit, or elements thereof, is by way of example only and is not intended to limit any of the aspects described herein.

Example Environment

FIG. 1 illustrates an example environment 100, which includes a computing device 102. In this example, the computing device 102 is implemented as a smart-phone. Although not shown, the computing device 102 may be implemented as any suitable computing or electronic device, such as a modem, cellular base station, broadband router, access point, cellular phone, gaming device, navigation device, media device, laptop computer, desktop computer, server, network-attached storage (NAS) device, smart appliance, vehicle-based communication system, and the like. The computing device 102 communicates data via cell towers 104-1, 104-2, and/or 104-n, which may be configured to provide a wireless network. Although shown as three cell towers, the cell towers 104-1 through 104-n may represent any suitable number of cell towers, where n is any suitable integer.

The cell towers 104 may communicate with the computing device 102 by transferring a communication link between the computing device 102 and cell towers 104, from one of the cell towers to another, commonly referred to as "handoff" of the communication link. In some aspects, other devices, such as a satellite, access point, wireless router, peer-to-peer device, mesh network node, or fiber-optic line, may provide an intermediate or alternate communication link for the computing device 102 and/or the cell towers 104. Therefore, the computing device 102 may communicate with the cell towers 104, or another device, via a wired connection, wireless connection, or a combination thereof.

The computing device 102 includes a processor 106 and computer-readable storage medium 108 (CRM 108). The processor 106 may include any type of processor, such as an application processor or multi-core processor, configured to execute processor-executable code stored by the computer-readable storage medium 108. The CRM 108 may include any suitable type of data storage media, such as volatile memory (e.g., random access memory (RAM)), non-volatile memory (e.g., Flash memory), optical media, magnetic media (e.g., disk or tape), and the like. In the context of this disclosure, the CRM 108 is implemented to store instructions 110, data 112, and other information of the computing device 102, and thus does not include transitory propagating signals or carrier waves.

The computing device 102 also includes input/output ports 114 (I/O ports 114), a display 116, and a wireless interface 118. The I/O ports 114 enable data exchanges or interaction with other devices, networks, or users. The I/O ports 114 may include serial ports (e.g., universal serial bus (USB) ports), parallel ports, audio ports, infrared (IR) ports, and the like. The display 116 presents graphics of the computing device 102, such as a user interface associated with an operating system, program, or application.

The wireless interface 118 provides connectivity to respective networks and other electronic devices connected therewith. Alternately or additionally, the computing device 102 may include a wired data interface, such as Ethernet or fiber optic interfaces for communicating over a local area network (LAN), intranet, or the Internet. The wireless interface 118 may facilitate communication over any suitable type of wireless network, such as a wireless LAN, peer-to-peer (P2P), cellular network, and/or wireless personal-area-network (WPAN). In the context of the example environment, the wireless interface 118 enables the computing device 102 to communicate with the cell towers 104.

Wireless interface 118 can be configured to implement any suitable communication protocol or standard, such as a 3rd Generation Partnership Project (3GPP) protocol, Global System for Mobiles (GSM), Enhanced Data Rates for GSM (EDGE), Code Division Multiple Access (CDMA), CDMA 2000 (lx), Wideband CDMA, Time Division Synchronous CDMA (TD-SCDMA), Evolution-Data Optimized (EVDO), Universal Mobile Telecommunications System (UMTS), Long Term Evolution (LTE), LTE frequency division duplex (LTE-FDD), LTE time division duplex (LTE-TDD), LTE Advanced (LTE-A), Institute of Electrical and Electronics Engineers (IEEE) 802.11 standard, IEEE 802.16 standard and the like. In some aspects, these communication protocols or standards use multiple-input multiple-output (MIMO) or carrier aggregation (CA) technology to communicate (e.g., LTE and variants thereof).

The wireless interface 118 includes a modem baseband 120 and RF transceiver 122 to process data and/or signals communicated by the computing device 102. The modem baseband 120 may be implemented as a system-on-chip (SoC) that provides a digital communication interface for data, voice, messaging, and other applications of the computing device 102. The modem baseband 120 may include a processor and memory (not shown) to implement signal processing functions to enable wireless communication, such as frequency translation, encoding, decoding, modulation, and/or demodulation. The modem baseband 120 may also include baseband circuitry to perform high-rate sampling processes that can include analog-to-digital conversion, digital-to-analog conversion, gain correction, skew correction, frequency translation, and the like.

The RF transceiver 122 includes transmit chains and receive chains for frequency translation, signal mixing, and filtering signals transmitted or received by the computing device. For example, the RF transceiver may translate RF signals to or from an intermediate frequency (IF), perform in-phase/quadrature (I/Q) operations, or filter signals via a low-pass or band-pass filter. Although shown as a single component, respective functions of the RF transceiver 122 may be implemented by a transmitter and receiver (not shown) implemented separately from each other.

With reference to signal transmission, the wireless interface 118 also includes a power amplifier 124 and envelope tracking (ET) power system 126. The power amplifier 124 amplifies signal modulated by the RF transceiver 122 prior to transmission. The ET power system 126 implements envelope tracking to deliver power to the power amplifier 124 at a voltage that follows an envelope of the modulated signal to be transmitted. By so doing, an efficiency of the power amplifier 124 can be increased by operating with minimal voltage overhead. The ET power system 126 also includes a synchronizer 128, the implementation and use of which varies, and is described below in greater detail.

The wireless interface 118 also includes RF front end 130 and antennas 132 to transmit the signals amplified by the power amplifier 124. The RF front end 130 may include antenna tuning circuits, multiple RF paths, band-specific filters, and switches that enable the transmission of signals through various combinations of the antennas 132. The antennas 132 may include any suitable number or configuration of antennas, such as wide-band, diversity, or tunable antennas, that enable communication over different frequency bands.

Figure 2:
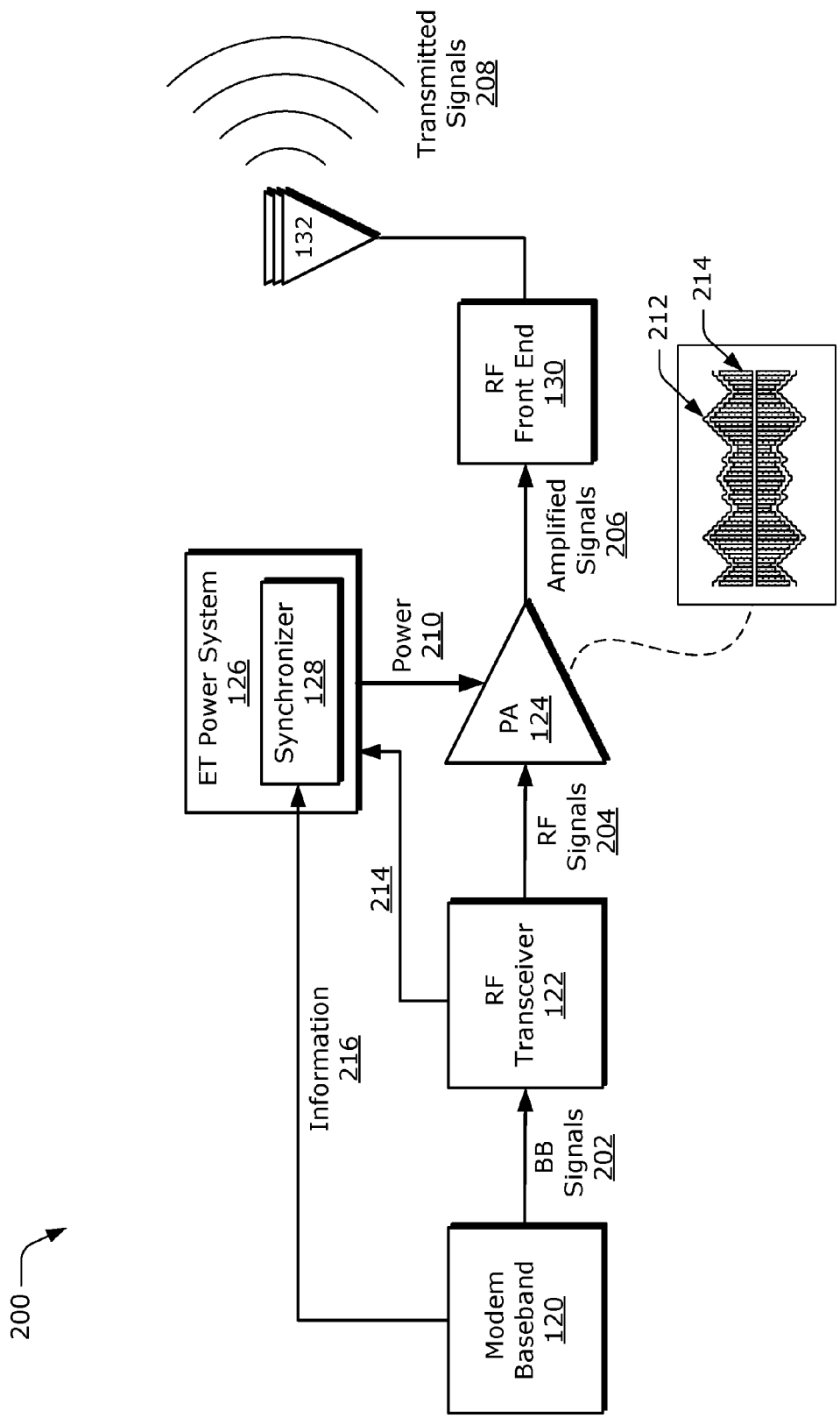
FIG. 2 illustrates an example configuration of the wireless interface shown in FIG. 1.

FIG. 2 illustrates an example configuration of the wireless interface 118 generally at 200. In this particular example, a transmit path through the components of the wireless interface 118 is shown. Although not shown, a receive path may be implemented in similar fashion with received signals bypassing the power amplifier 124 (e.g., via a low-noise amplifier (LNA)) from the RF front end 130 to the RF transceiver 122. In at least some aspects, the wireless interface 118 is configured to support concurrent transmit and receive operations, such as to communicate in accordance with the LTE-FDD and LTE-Advanced standards. In such cases, the power amplifier 124 may be active while signals are concurrently received by a receive chain of the wireless interface 118.

The modem baseband 120 coordinates with one of the cell towers 104 to establish and define parameters of a communication link. For example, the modem baseband 120 can receive information describing a communication mode, physical broadcast channels, transmit bands, receive bands, antenna configuration, link bandwidth, resource mapping, and the like. Based on this information, the modem baseband 120 configures other components of the wireless interface for signal transmission and/or reception, such as the RF transceiver 122, power amplifier 124, and RF front end 130.

Generally, to transmit data, the modem baseband 120 encodes the data into baseband signals 202 (BB signals 202). These BB signals 202 are then modulated by the RF transceiver 122 with a carrier frequency to provide RF signals 204. Prior to transmission, the power amplifier 124 amplifies the RF signals 204 and amplified signals 206 enter the RF front end 130 for routing or band-specific filtering. The antenna 132 then radiates the amplified signals 206 as transmitted signals 208, which are received by the cell tower 104 with which the communication link is established.

During amplification, power amplifier 124 receives power 210 from the ET power system 126, which is described in more detail below. The ET power system 126 adjusts a voltage 212 at which the power 210 is provided to the power amplifier 124 such that the voltage 212 follows an envelope 214 of the RF signals 204 being amplified. Here, the synchronizer 128 receives information 216 from the modem baseband 120 that may describe a receive band, a receive channel, or a center frequency thereof. In at least some aspects, the synchronizer 128 uses the information received from the modem baseband 120 to reduce noise harmonics of power provided by the ET power system 126, the aspects of which are described in more detail below.

Example Switch-Mode Power Supply Circuit

Figure 3:
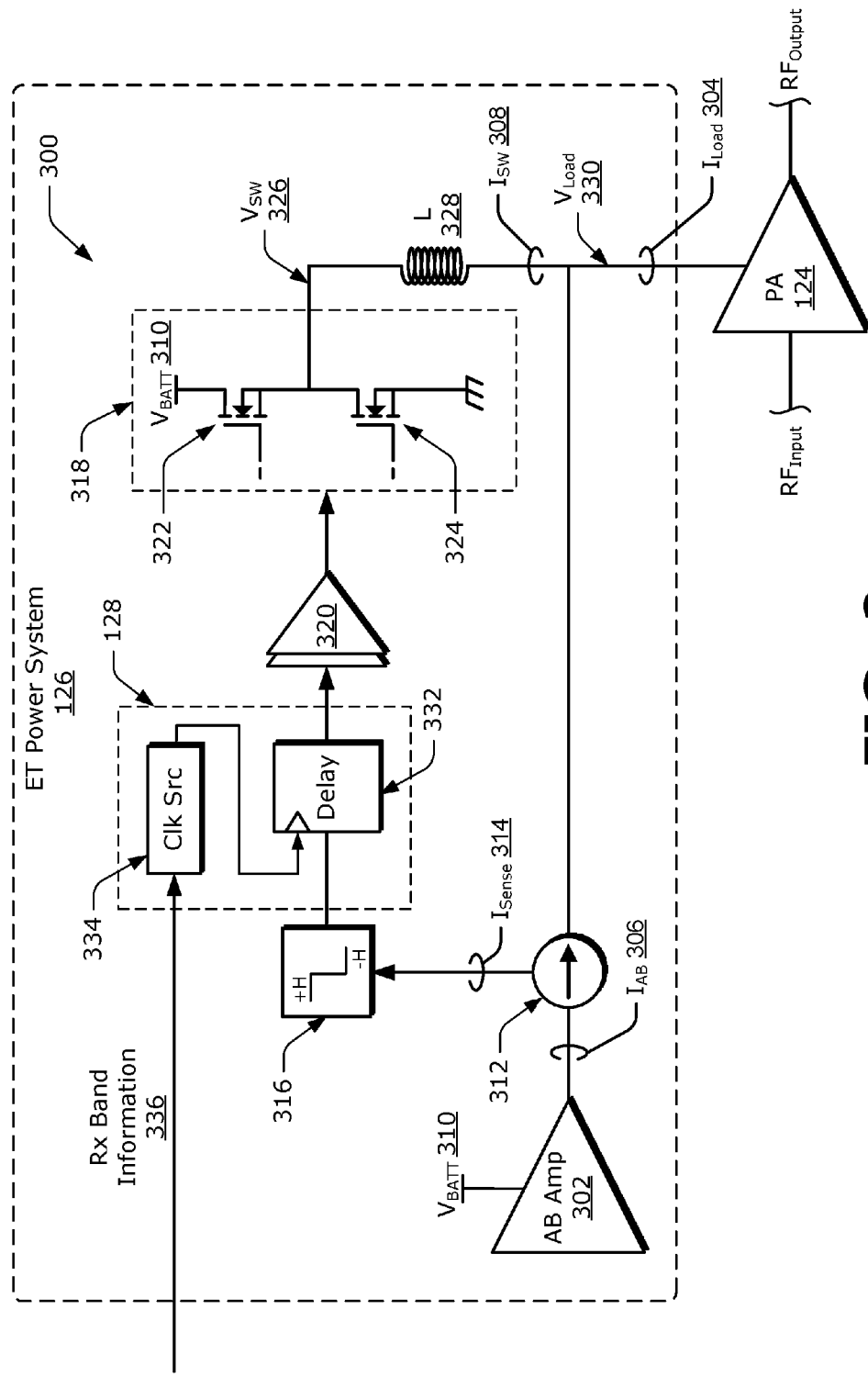
FIG. 3 illustrates an example switch-mode power supply circuit that is synchronized in accordance with one or more aspects.

FIG. 3 illustrates an example switch-mode power supply circuit that is synchronized in accordance with one or more aspects at 300. In this particular example, the switch-mode power supply (SMPS) circuit 300 is implemented as part of the ET power system 126. In the following description, components of circuits may be connected (e.g., directly) or operably connected by one or more intervening components. Further, signal- or current-carrying structures of the circuits may be implemented as any suitable type of conductor, such as wires, printed-circuit board (PCB) traces, etched metal layers, contacts, nets, paths, rails, package-on-package (POP) structures, and the like. The use of these terms is not meant to limit configurations of any circuit, but to provide context for describing the circuits of the accompanying figures.

The ET power system 126 provides power to the power amplifier 124 with the SMPS circuit 300 and a class AB amplifier 302. In this parallel configuration, load current 304 ($I_{Load}$ 304) provided to the power amplifier 124 is a summation of the class AB amplifier 302's current ($I_{AB}$ 306) and current 308 of the SMPS circuit 300 ($I_{SW}$ 308). This enables the class AB amplifier 302 to provide high frequency components of the $I_{Load}$ 304 and the SMPS circuit 300 to provide the low frequency components of $I_{Load}$ 304.

The class AB amplifier 302 is powered from battery voltage 310 ($V_{Batt}$ 310) and may source current to, or sink current from, the power amplifier 124. In this example, the SMPS circuit 300 functions as a slave to the class AB amplifier 302 via a current sensor 312 that monitors an amplitude, amount, and/or direction of the current 306 of the class AB amplifier. The current sensor 312 provides an indication of the sensed current 314 ($I_{Sense}$ 314) to a hysteretic controller 316 of the SMPS circuit 300, which may include a comparator having predefined current thresholds. Based on the indication of the sensed current 314, the hysteretic controller 316 controls buck switches 318 of the SMPS circuit 300 via gate drivers 320.

The buck switches of the SMPS circuit 300 include a high-side switch 322 and low-side switch 324 connected in series between a power rail and ground rail. The buck switches 318 can be implemented as any suitable type or number of switch elements. In this particular example, the high-side switch 322 and low-side switch 324 are implemented as N-channel metal-oxide-semiconductor field-effect-transistors (MOSFETs). Activating the buck switches 318 controls switching voltage 326 ($V_{SW}$ 326) at the output of the buck switches 318, and thus current to flow from the battery voltage source 310 or ground into an inductor 328. This current is then provided to the power amplifier 124 along with the current 306 of the class AB amplifier.

In some aspects, when the class AB amplifier 302 is sourcing current, the hysteretic controller 316 activates the high-side switch 322 to increase inductor current flow and provide current to the power amplifier 124. Alternately, when the class AB amplifier 302 is sinking current, the hysteretic controller 316 activates the low-side switch 324 to decrease inductor current flow (due to inductor voltage) and reduce current provided to the power amplifier 124.

The hysteretic control of the buck switches between the battery voltage source 310 (or another power rail) and ground results in switching waveform in the switch node voltage 326 of the SMPS circuit. Transitions of the switching waveform can be sharp, approximating a square-wave and may contribute to noise that propagates through the inductor 328 to a load voltage 330 ($V_{Load}$ 330) at a power input pin or node of the power amplifier 124. As described above, noise entering the power amplifier 124 may modulate with various RF signals and spread across the frequency spectrum, which may cover receive bands of the wireless interface 118.

In some aspects, the SMPS circuit 300 includes a synchronizer 128 to synchronize the switching waveform of the buck switches 318. Although referred to as synchronizing the switching waveform, the synchronizer 128 may synchronize any aspect of the switching power supply's operation, such as switch control signals, gate drivers, switch activation/deactivation, the switching waveform, output ripple voltage, and the like. The switching waveform can be synchronized to any suitable frequency, such as a center frequency of a receive band. By so doing, a notch may be created in spectral energy of noise generated by the switching waveform, thereby reducing interference in the receive band. Although shown between the hysteretic controller 316 and the gate drivers 320, the synchronizer 128 may be implemented in combination with other components or between components of a feedback and/or control loop for the buck switches 318.

The synchronizer 128 includes a delay circuit 332 and a configurable clock source 334. The delay circuit 332 may be implemented as any suitable type of circuit or component capable of delaying a signal transition based on a clock input, discrete-time delay, quantized period of time, and the like. For example, the delay circuit 332 may comprise a latch that controls rising and/or falling edges of a propagated signal based on an input clock. Alternately or additionally, the delay circuit 332 can be implemented using a one-shot timing circuit configured to control at least a falling edge of a signal such that a duration of a signal is a multiple of a discrete delay or period of a clock. In some embodiments, the synchronizer comprises a flip flop, for example that controls an on/off time to be a multiple of a center frequency.

The clock source 334 is configurable clock source that is capable of providing a clock signal at any suitable frequency, such as a range of approximately one MHz to 100 MHz. For example, the clock source 334 may be implemented as a phase-locked-loop (PLL) clock, a delay-locked-loop (DLL) clock, or voltage-controlled oscillator (VCO) based clock circuit. In some cases, the clock source 334 is programmable or dynamically configurable to provide a frequency based on receive band information 336 provided by modem baseband 120. Alternately or additionally, the clock source 334 may comprise or receive input from a local oscillator or clock of a receive chain (not shown) of the wireless interface. In such cases, the clock source 334 may be configured to apply, based on the receive band information 336, an offset to the receive chain clock (or a transmit chain clock) to provide a synchronization frequency.

In at least some aspects, the clock source 334 determines a center frequency of a receive band based on the receive band information 336. The clock source 334 may calculate the center frequency based on the receive band information, such as channel or bandwidth information. In some cases, the clock source 334, or a controller associated therewith, accesses a lookup table (LUT, not shown) to determine the center frequency based on an indication of receive band selected for communication. Alternately or additionally, the modem baseband 120 may configure the clock source to provide a clock signal at the center frequency of the receive band.

Techniques for Synchronizing a Switch-Mode Power Supply

The following techniques for synchronizing a switch-mode power supply may be implemented using any of the previously described entities of the example environment, components, or circuits. Reference to entities, such as the modem baseband 120, ET power system 126, synchronizer 128, delay circuit 332, or clock source 334, is made by example only and is not intended to limit the ways in which the techniques can be implemented. The techniques are described with reference to example methods illustrated in FIGS. 4, 7, and 10, which are depicted as respective sets of operations or acts that may be performed by entities described herein. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 4:
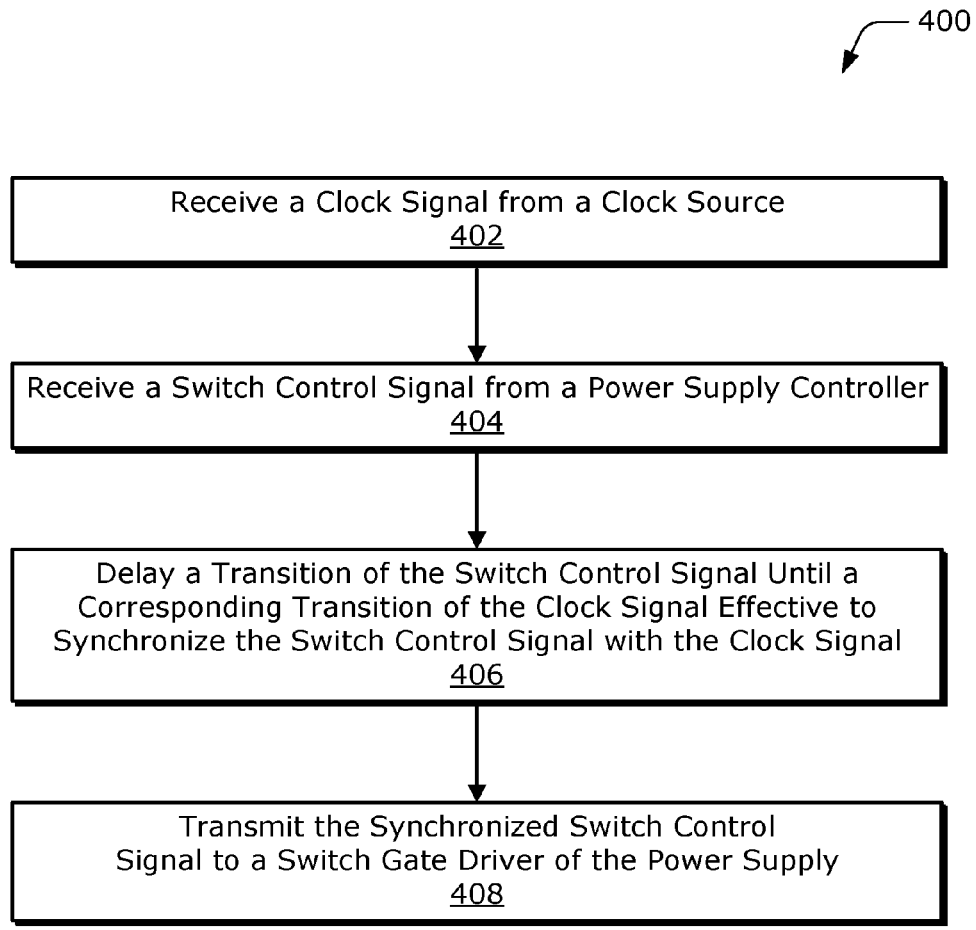
FIG. 4 illustrates an example method for synchronizing a switch control signal with a clock signal.

FIG. 4 illustrates an example method 400 for synchronizing a switch control signal with a clock signal. The operations described herein may be performed using any suitable circuitry or component, which may provide means for implementing one or more of the operations. In some cases, the operations are performed by an apparatus (e.g., a modem baseband or ET power block) configured to reduce noise in a receive band of a wireless interface. In such cases, instructions executed by a processor of the apparatus may cause the apparatus to perform the operations.

At 402, the method comprises receiving a clock signal from a clock source. The clock source may be configured to provide a clock signal with a frequency corresponding to a center frequency of a receive band or a fundamental harmonic thereof. The clock source may include any suitable clock source, such as a PLL, DLL, or VCO based clock circuit. In some cases, the frequency of the clock source is configured or selected by a modem baseband or other communication controller of a wireless interface.

By way of example, consider the ET power system 126 of the wireless interface 118. Here, assume that the wireless interface 118 is communicating in an LTE-FDD mode in which data is transmitted and received concurrently. With reference to FIG. 3, the power amplifier 124 amplifies RF signals for transmission and a receive chain of the wireless interface receives RF signals transmitted by one of the cell towers 104. The SMPS circuit 300 and class AB amplifier 302 provide power to the power amplifier 124, with the SMPS circuit 300 providing low frequency components of the power.

Figure 5:
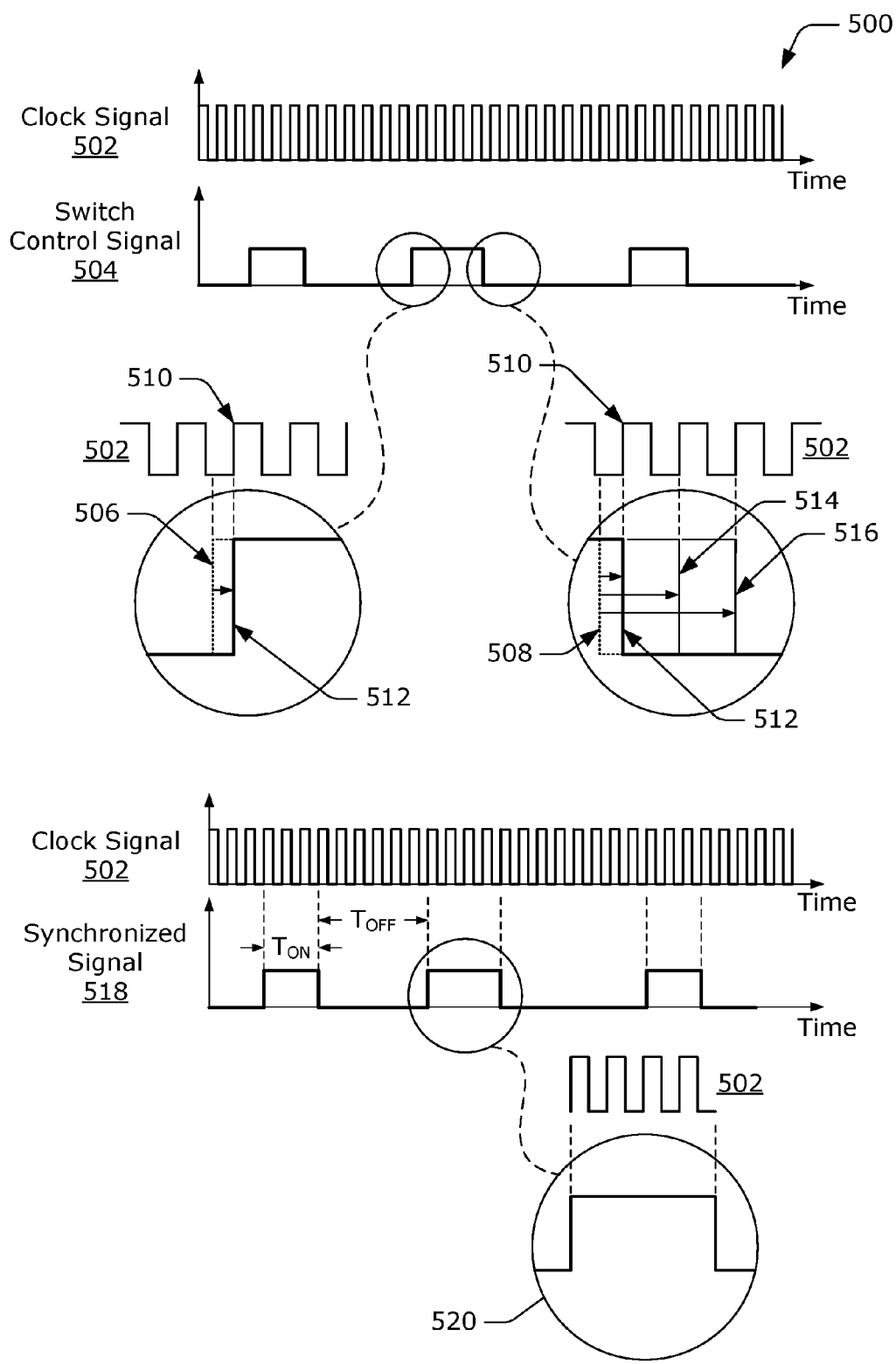
FIG. 5 illustrates an example of a switch control signal synchronized in accordance with one or more aspects.

Based on the receive band of the receive chain, the modem baseband 120 configures clock source 334 of the synchronizer 128 to generate a clock signal at the center frequency of the receive band. The delay circuit 332, which for this example assume is configured as a latch, receives the clock signal generated by the clock source at a clock input. FIG. 5 illustrates example signals generally at 500, which includes a clock signal 502 that may be received by the delay circuit 332.

At 404, the method includes receiving a switch control signal from a hysteretic controller of a switching power supply. The hysteretic controller may provide switch control signals based on an indication of current sank or sourced by a class AB amplifier. In some cases, the class AB amplifier is configured to provide current in parallel with the switching power supply to an RF power amplifier. In such cases, the switching power supply can function as a slave to the class AB amplifier, which provides higher frequency components of the power to the RF power amplifier.

In the context of the present example, the hysteretic controller 316 monitors current flow 306 of the class AB amplifier 302 via current sensor 312. Comparing this current flow to predefined thresholds, the hysteretic controller 316, or a similarly configured comparator, generates a switch control signal to control the buck switches 318 of the SMPS circuit 300. The delay circuit 332 of the synchronizer 128 receives the switch control signal at a signal input of the delay circuit. A detailed example of a switch control signal 504 is illustrated in FIG. 5 relative the clock signal 502. Here, note that the clock signal 502 (e.g., 10-200 MHz) is shown having a reduced frequency for visual clarity and is not presented to scale relative the switch control signal 504 (e.g., 4-8 MHz).

At 406, the method comprises delaying a transition of the switch control signal until a corresponding transition of the clock signal. For a rising transition of the switch control signal, a corresponding transition may include a clock signal transition indicating a start of a clock period. For a falling transition of the switch control signal, a corresponding transition may include a clock signal transition indicating an end of the clock period or a subsequent clock period.

The method may delay a rising edge or falling edge of the switch control signal. In some cases, a latch delays, based on a clock signal, both the rising edge and falling edge of a pulse in the switch control signal. In other cases, a one-shot delays a falling edge of the pulse such that a duration of the pulse corresponds to an integer number of clock periods or other discrete delay value that may be predefined or dynamically configured. Alternately or additionally, a transition of the switch control signal can be delayed for a different or random number of clock periods.

Continuing the ongoing example, the delay circuit 332 of the synchronizer 128 delays at least one transition of the switch control signal 504. In this example, the delay circuit 332 delays both a rising transition 506 and a falling transition 508 of the switch control signal 504. Specifically, the delay circuit 332 delays the rising transition 506 of the switch control signal 504 until a rising edge 510 of the clock signal 502 to provide an aligned rising transition 512. Similarly, the delay circuit 332 delays the falling transition 508 of the switch control signal 504 until another rising edge 510 of the clock signal 502 (e.g., at the end of a integer number of clock periods) to provide an aligned falling transition 512. By aligning transitions of the switch control signal 504, the delay circuit 332 provides a synchronized switch control signal 118 (synchronized signal 518). A detailed view of a synchronized switch control pulse is shown at 520, the duration of which includes an integer number of periods of the clock signal 502.

At 408, the method includes transmitting the synchronized switch control signal to a switch gate driver. The synchronized switch control signal may be transmitted from an output of a latch or one-shot. For example, a latch that receives a switch control signal at an input then transmits, after synchronizing transitions of the switch control signal to a clock, a synchronized switch control signal, such as the synchronized signal 518 of FIG. 5.

Transmitting the synchronized switch control signal to the switch gate driver can be effective to synchronize operation of buck switches that are driven by the gate drivers. Concluding the present example, the delay circuit 332 transmits a synchronized switch control signal to gate drivers 320, which in turn activate the gates of buck switches 318. By so doing, operation of the buck switches 318 is synchronized with the clock signal having the center frequency of the receive band in which a receive chain of the wireless interface 118 receives signals.

Synchronizing operation of the buck switches 318 can be effective to reduce noise around a frequency to which the switching operations are synchronized. A conventional switching waveform approximates a square-wave that introduces noise across a broad frequency spectrum. By synchronizing the switching waveform to a frequency, a notch can be created in switching noise at that frequency.

$$\text{Energy}_{f_{center}} = |\int_0^t Vsw(t) \cdot \sin 2\pi f_{center} t|^2 + |\int_0^t Vsw(t) \cdot \cos 2\pi f_{center} t|^2 \quad \text{Equation 1}$$

For example, consider Equation 1, which describes energy of a pulse train that approximates the switching waveform. By ensuring that the duration of each pulse of the switching waveform's on-time comprises an integer number of synchronization clock periods ($1/f_{center}$), the first and second terms of the equation may become an integration of a sin (and cos) signal over an integer number of periods, which yields zero for both terms. Therefore, the energy at $f_{center}$ approaches a zero value.

Figure 6:
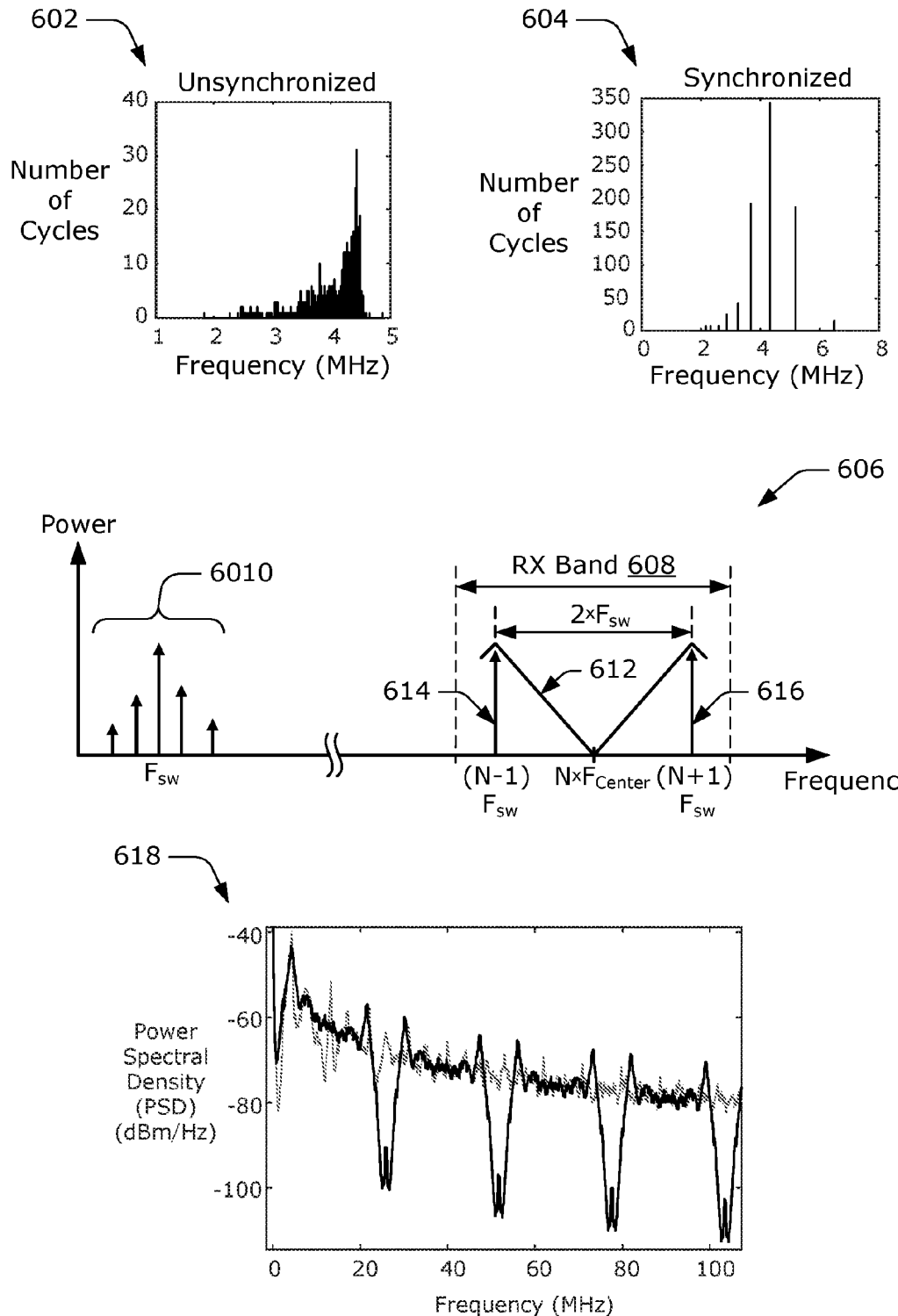
FIG. 6 illustrates an example histogram and power spectral densities of a synchronized switching supply.

FIG. 6 illustrates an example frequency histogram and power spectral densities of a synchronized switching supply. As shown at 602, power of an unsynchronized switching waveform is distributed across a wide range of frequencies. As shown at 604, when synchronized to a clock signal, such as a center frequency of a receive band, most of the switching waveform's power is distributed at a frequency of the switching operations and integer factors of the synchronization clock frequency.

At 606, example power spectral density is shown relative a receive band 608. Here, note that most of the spectral power occurs at a switching frequency ($f_{sw}$) of the switching of the buck switches as shown at 610. At the receive band 608, a notch 612 is created at an integer multiple of the center frequency ($f_{center}$), and between adjacent peaks 614 and 616 of energy that occur at next integer multiples of the switching frequency. As such, an increase in the switching frequency increases a width of the notch around the harmonics of center frequency. Further, setting the switching frequency to be at least half the bandwidth of the receive band may ensure that the notch at the center frequency covers the bandwidth of the receive band.

Another power spectral density graph 618 shows a set of notches that occur at the synchronization frequency and harmonics thereof. With reference to a power spectral density of an unsynchronized switching power supply (shown in grey), the notches of a synchronized power supply are approximately 30 dB deep and have a width of twice the switching frequency of the synchronized power supply. As such, synchronizing a switching waveform of a power supply to a center frequency of a receive band can substantially reduce a level of noise in that receive band.

Figure 7:
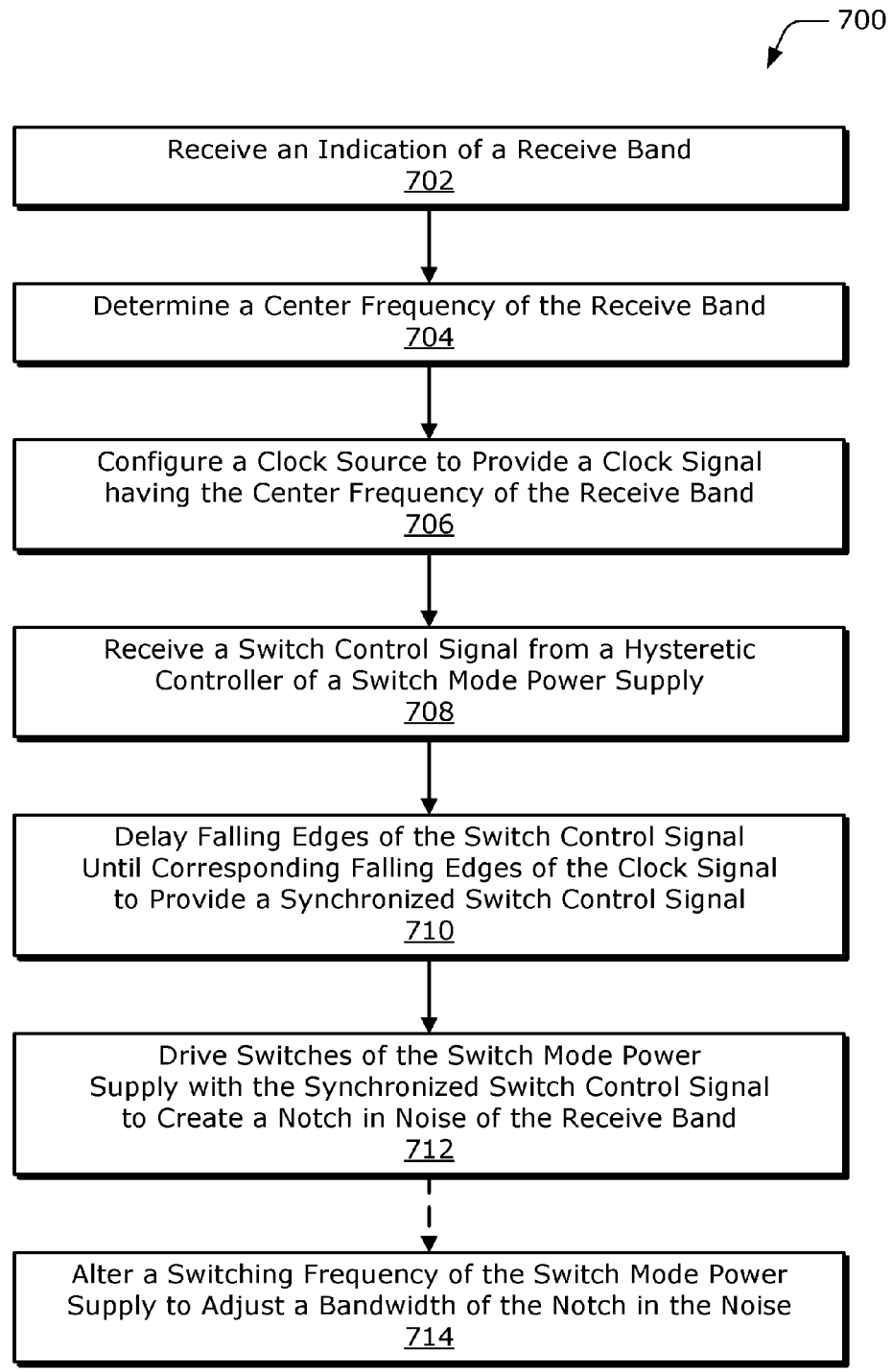
FIG. 7 illustrates an example method for driving switches of a switch-mode power supply with a synchronized switch control signal.

FIG. 7 illustrates an example method 700 for driving switches of a switch-mode power supply with a synchronized switch control signal. The operations described herein may be performed using any suitable circuitry or component, such as synchronizer 128, delay circuit 332, or clock source 334.

At 702, the method comprises receiving an indication of a receive band. The indication may be received from a modem baseband or communication controller of a wireless interface. The indication may indicate a predefined receive band, a communication mode of the receiver, receive band or channel parameters, or any suitable combination thereof. For example, a synchronizer block implemented by firmware of the modem baseband may receive an indication of a receive band from a scheduler or communications manager of the modem baseband.

At 704, the method includes determining a center frequency of the receive band. The center frequency may be calculated based on the receive band information, such as receive channel or bandwidth information. In some cases, a lookup table is accessed based on the indication of the receive band to determine a center frequency for the receive band. Alternately or additionally, a center frequency may be determined for a fundamental harmonic of the receive band such that an integer multiple of the harmonic's center frequency coincides with a center of the receive band.

At 706, the method comprises configuring a clock source to provide a clock signal having the center frequency of the receive band. In some cases, a PLL or DLL is configured to provide the clock signal having the center frequency. For example, the modem baseband 120 may set a PLL or DLL of the synchronizer 128 to provide a clock signal having the center frequency of the receive band.

At 708, the method includes receiving a switch control signal from a hysteretic controller of a switch-mode power supply. The hysteretic controller may provide switch control signals based on an indication of current sank or sourced by a class AB amplifier. For example, a latch or one-shot circuit of the synchronizer 128 may receive a switch control signal from the hysteretic controller 316 responsive to the class AB amplifier 302 sourcing or sinking current.

At 710, the method comprises delaying falling edges of the switch control signal until corresponding edges of the clock signal. The falling edges are delayed such that a duration of a pulse in the switch control signal comprises an integer number of clock periods. For example, when the delay circuit 332 is configured as a one-shot timer, the delay circuit 332 delays the falling edge of the switch control signal until a next clock transition such that the pulse includes an integer number of clock periods.

At 712, the method includes driving switches of the switch-mode power supply with the synchronized control signal. This is effective to create a notch in switching noise in the receive band. As described with reference to FIG. 6, the notch in the receive band noise may be approximately 30 dB deep and have an approximate bandwidth of twice the switching frequency of the switch-mode power supply.

At 714, the method comprises altering a switching frequency of the switch-mode power supply to adjust a width of the notch in the noise. Here, recall that a width of the notch is twice the switching frequency and that noise of the notch is pushed to a next interval of the switching frequency. To ensure that the notch covers the receive band, the switching frequency can be altered such that the switching frequency is at least half the bandwidth of the receive channel.

Figure 8:
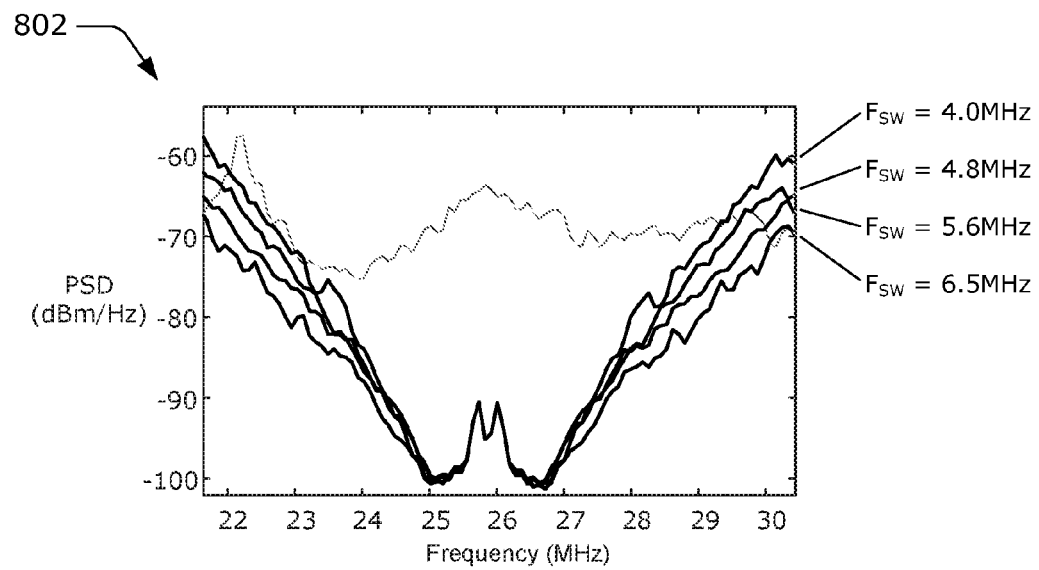
FIG. 8 illustrates example power spectral densities for various switching frequencies of a synchronized power supply.
Figure 8:
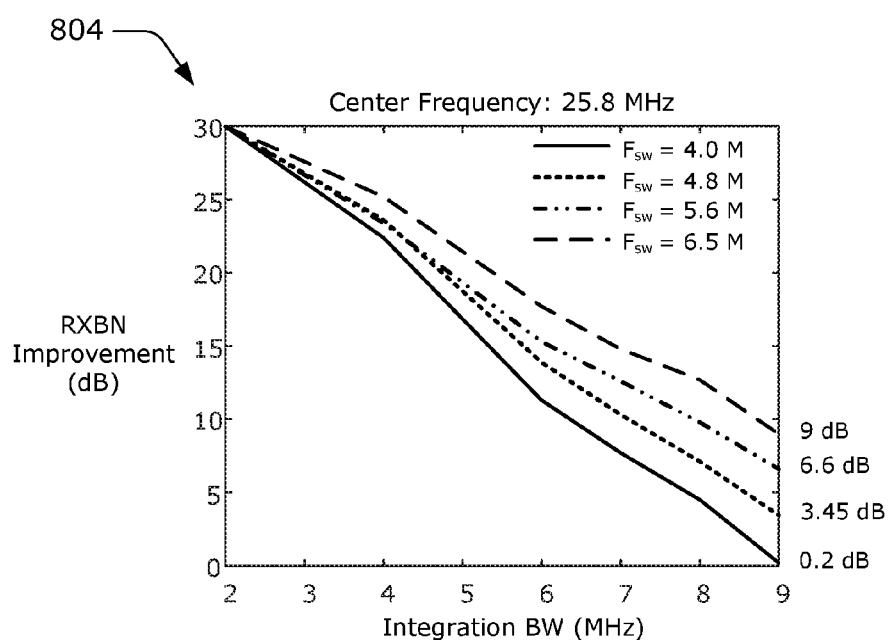

By way of example, consider FIG. 8, which power spectral densities of notches created with various switching frequencies. As shown at 802, increasing the switching frequency from 4.0 MHz to 6.5 MHz increases the width of the notch. As such, a position and width of the notch in the receive band can be dynamically controlled by altering the synchronizing clock signal and the switching frequency. An example of this is shown at 804, in which improvement in the receive band noise is shown in relation to various switching frequencies of the switch-mode power supply.

Figure 9:
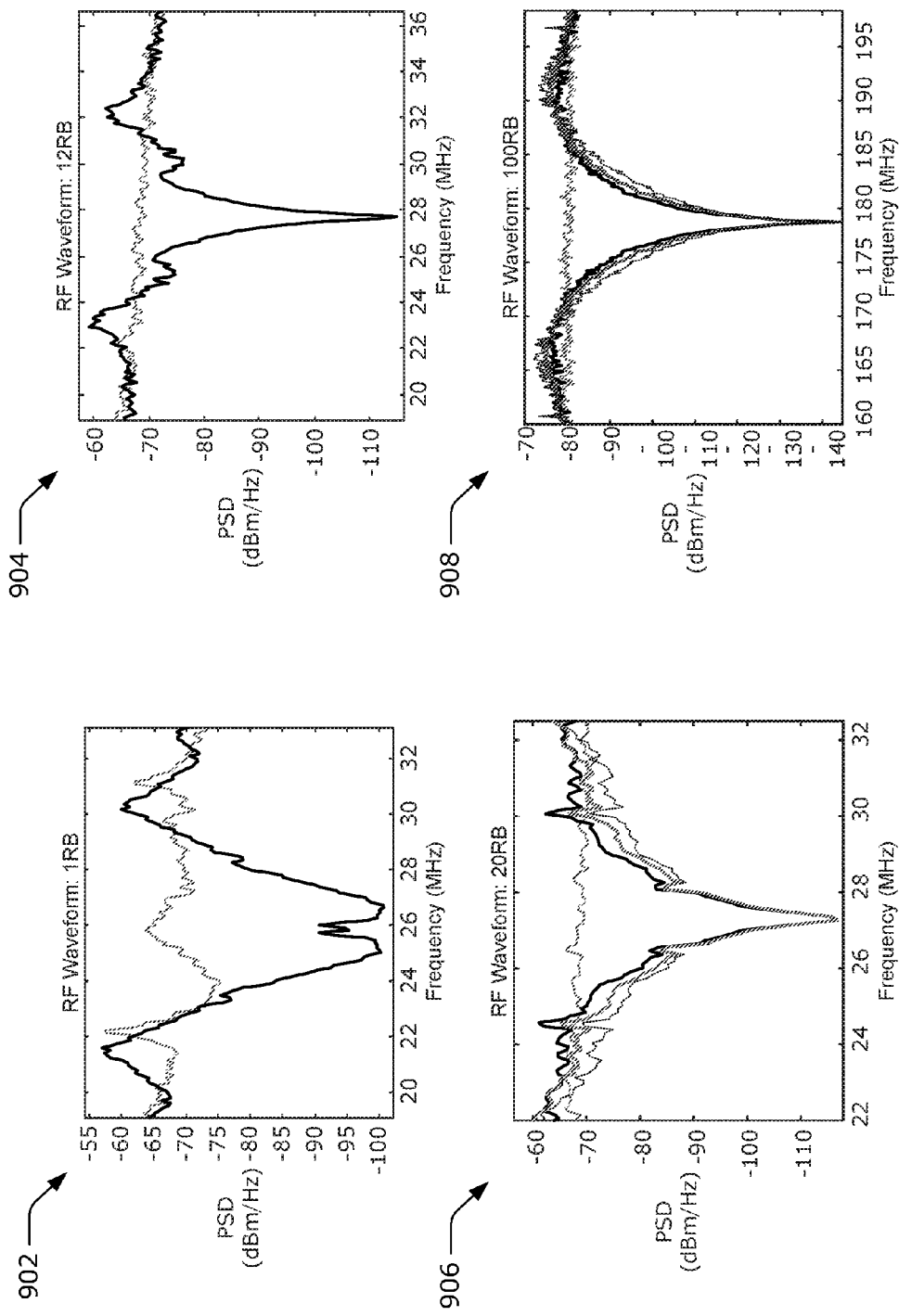
FIG. 9 illustrates example power spectral densities for various RF waveforms.

FIG. 9 illustrates additional power spectral densities for various RF waveforms having different receive bands. Receive band characteristics, such as bandwidth, can vary with resource allocation or RF waveform selection in LTE communication schemes. For resource block allocation in LTE, each resource block (RB) includes 12 subcarriers and occupies 180 KHz of bandwidth. In FIG. 9, notches in the receive band noise are shown for receive bands of various RB allocation, such as 1RB at 902, 12RB (2.16 MHz) at 904, 20RB (3.6 MHz) at 906, and 100RB (20 MHz) at 908. Here, note that for wider receive bandwidths of 20RB or 100RB, increasing the switching frequency can increase a width of the notch (indicated by the dotted line) to better suppress noise in the receive band.

Figure 10:
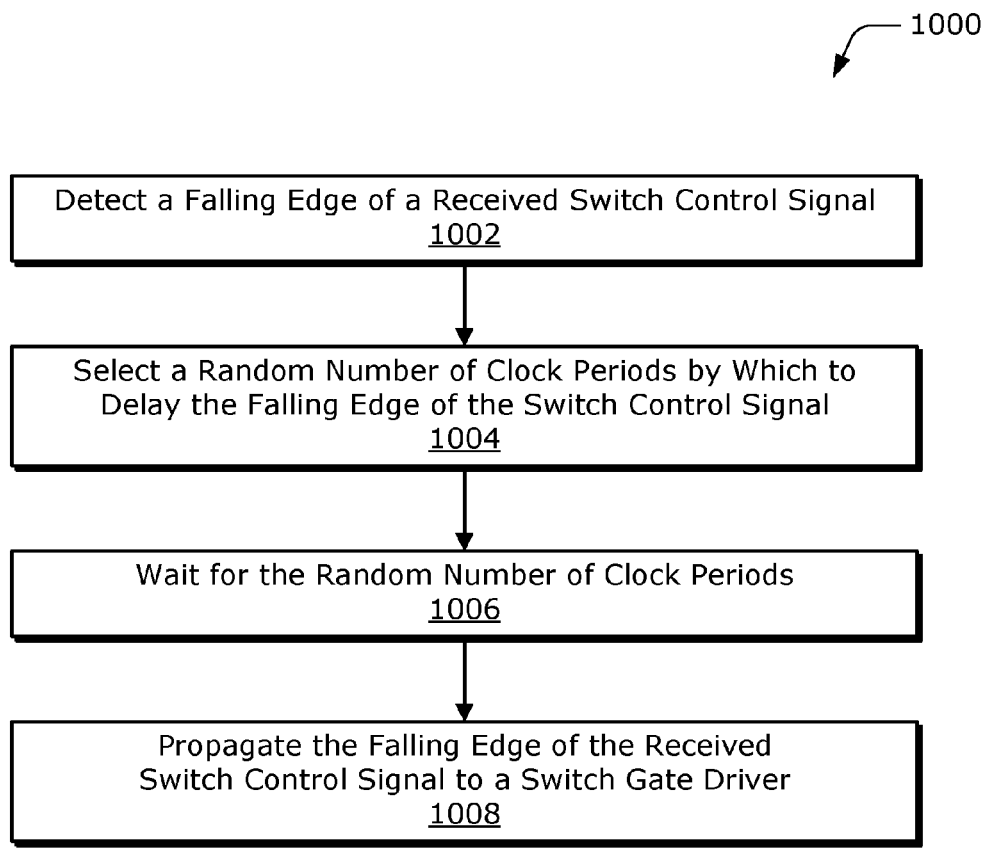
FIG. 10 illustrates an example method for randomizing a number of clock periods applied to a switch control signal for synchronization.

FIG. 10 illustrates an example method 1000 for randomizing a number of clock periods applied to a switch control signal for synchronization. The operations described herein may be performed using any suitable circuitry or component, such as synchronizer 128, delay circuit 332, or clock source 334.

At 1002, the method comprises detecting a falling edge of a received switch control signal. In some cases, a duration of a pulse in the switch control signal can be altered by controlling the falling edge of the switch control signal. For example, a latch or one-shot can control the falling edge of the switch control signal such that the duration of the pulse comprises an integer number of periods of a synchronization clock.

At 1004, the method includes determining a random number of clock periods by which to delay the falling edge of the switch control signal. In some cases, having synchronized control signal pulses of different duration can be effective to further reduce noise proximate a receive band. For example, a hysteretic controller that generates control signal pulses of similar length will cause noise at particular frequency intervals. By randomizing durations of the control signal pulses, this noise can be spread over more frequency intervals, thereby reducing peak noise levels.

At 1006, the method comprises waiting for the determined number of random clock periods. Instead of synchronizing the falling edge of the control signal with an end of an immediate synchronization clock period, the method waits for the determined number of random clock periods. Alternately or additionally, the method may wait for a predetermined number of clock cycles. For example, the method may wait for a different number of clock cycles for each falling edge of the control signal to vary respective durations of the control signal pulses.

At 1008, the method includes propagating the falling edge of the received switch control signal to a switch gate driver. After waiting for the random or predetermined number of clock periods, the method propagates the falling edge to the switch gate driver. Based on this falling edge, the switch gate drive may stop driving a high-side switch and active a low-side switch to provide current to an inductor powering an RF power amplifier. By varying or randomizing a number of synchronization clock periods to which the switching waveform is synchronized, noise of the switching waveform can be spread over more frequencies intervals, thereby reducing peak levels of the switching noise.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for wireless communication, the apparatus comprising:
a radio frequency (RF) power amplifier;
an envelope tracking (ET) power system comprising:
a switch coupled between a power rail and the RF power amplifier;
a gate driver having an output connected to a gate of the switch;
an amplifier connected to the power rail and having an output coupled to the RF power amplifier;
a comparator configured to control the gate driver based on an indication of current flow between the amplifier and the RF power amplifier; and
a delay circuit connected between an output of the comparator and an input of the gate driver.

2. The apparatus as recited in claim 1, further comprising an inductor that is coupled between the switch and the RF power amplifier.

3. The apparatus as recited in claim 1, further comprising a current sensor connected between the output of the amplifier and the RF power amplifier, the current sensor having an output that is coupled to an input of the comparator.

4. The apparatus as recited in claim 1, wherein the delay circuit comprises a one-shot timing circuit.

5. The apparatus as recited in claim 1, wherein the delay circuit comprises a latch circuit.

6. The apparatus as recited in claim 5, wherein the ET power system further comprises a clock source, and a clock input of the latch circuit is connected to the clock source.

7. The apparatus as recited in claim 6, wherein the clock source is a programmable phase-locked-loop clock or a programmable delay-locked-loop clock.

8. The apparatus as recited in claim 7, wherein the programmable phase-locked-loop clock or programmable delay-locked-loop clock are configured based on a receive band setting of the apparatus.

9. The apparatus as recited in claim 1, wherein an operating frequency of the switch is set based on a bandwidth of a receive band by which the apparatus is configured to receive RF signals.

10. A power supply circuit, the circuit comprising:
a first switch connected between a power rail and a first terminal of an inductor, a second terminal of the inductor coupled to an output of the circuit;
a second switch connected between a ground rail and the first terminal of the inductor;
a first gate driver having an output connected to a gate of the first switch;
a second gate driver having an output connected to a gate of the second switch;
an amplifier connected to the power rail and having an output coupled to the output of the circuit;
a current sensor connected between the output of the amplifier and the output of the circuit;
a comparator having an input connected to an output of the current sensor; and
a delay circuit connected between an output of the comparator and respective inputs of the first and second gate drivers.

11. The power supply circuit as recited in claim 10, wherein the delay circuit comprises a latch circuit or a one-shot timing circuit.

12. The power supply circuit as recited in claim 10, further comprising a clock source and wherein a clock input of the delay circuit is connected to the clock source.

13. The power supply circuit as recited in claim 12, wherein the clock source is a programmable phase-locked-loop clock or a programmable delay-locked-loop clock.

14. The power supply circuit as recited in claim 12, wherein the clock source generates a clock signal based on information that describes one or more radio frequency (RF) receive bands or RF receive channels.

15. The power supply circuit as recited in claim 10, wherein the delay circuit synchronizes respective control signals of the first and second gate drivers with an RF frequency signal.

16. The power supply circuit as recited in claim 10, wherein the current sensor monitors an amount of current sourced or sank by the amplifier and the comparator is configured to control the first and second switches based on the amount of current sourced or sank by the amplifier.

17. The power supply circuit as recited in claim 16, wherein the amplifier is a class AB amplifier configured to provide power in parallel with the first and second switches.

18. The power supply circuit as recited in claim 10, wherein the output of the circuit is connected to a radio frequency (RF) power amplifier that receives power provided by the first and second switches and the amplifier connected to the power rail.

19. The power supply circuit as recited in claim 10, wherein the comparator is a hysteretic comparator configured to control the first and second switches based on an indication of current provided by the current sensor.

20. The power supply circuit as recited in claim 10, wherein the power supply circuit is implemented in whole or part as an envelope tracking power system.

21. A power supply circuit for a radio frequency (RF) power amplifier, the circuit comprising:
   a first switch connected between a power rail and a first terminal of an inductor, a second terminal of the inductor coupled to the RF power amplifier;
   a second switch coupled between ground and the first terminal of the inductor;
   a first gate driver connected to a gate of the first switch;
   a second gate driver connected to a gate of the second switch;
   a current sensor coupled to the second terminal of the inductor;
   a comparator having an input connected to an output of the current sensor; and
   a delay circuit coupled between an output of the comparator and respective inputs of the first and second gate drivers, the delay circuit configured to synchronize respective control signals of the first and second gate drivers based on a frequency that is within one or more RF receive bands or RF receive channels.

22. The power supply circuit as recited in claim 21, further comprising a clock source coupled to the delay circuit that is configured to generate a clock signal based on information that describes the one or more RF receive bands or RF receive channels.

23. The power supply circuit as recited in claim 21, further comprising a class AB amplifier having an output coupled to the second terminal of the inductor and wherein the current sensor is coupled between the output of the class AB amplifier and the second terminal of the inductor.

24. The power supply circuit as recited in claim 23, wherein:
   the current sensor is configured to monitor an amount of current sourced or sank by the class AB amplifier; and
   the comparator is configured to control the first and second switches based on the amount of current sourced or sank by the class AB amplifier.

25. The power supply circuit as recited in claim 21, wherein the wherein the delay circuit comprises a one-shot timing circuit or a latch circuit.

26. The apparatus as recited in claim 1, wherein the amplifier is a class AB amplifier configured to provide power to the RF power amplifier in parallel with the switch of the ET power system.

* * * * *